(12) United States Patent
Eom

(10) Patent No.: US 10,045,438 B2
(45) Date of Patent: Aug. 7, 2018

(54) SUPPORT-TYPE DISPLAY DEVICE

(71) Applicant: Ho Seob Eom, Seoul (KR)

(72) Inventor: Ho Seob Eom, Seoul (KR)

(73) Assignee: REEF. T. MAX CO., LTD., Seoul (KR)

( * ) Notice: Subject to any disclaimer, the term of this patent is extended or adjusted under 35 U.S.C. 154(b) by 461 days.

(21) Appl. No.: 14/357,569

(22) PCT Filed: Nov. 8, 2012

(86) PCT No.: PCT/KR2012/009367
§ 371 (c)(1),
(2) Date: May 11, 2014

(87) PCT Pub. No.: WO2013/069970
PCT Pub. Date: May 16, 2013

(65) Prior Publication Data
US 2014/0340858 A1   Nov. 20, 2014

(30) Foreign Application Priority Data

Nov. 10, 2011   (KR) .................. 10-2011-0116810

(51) Int. Cl.
*H05K 1/00* (2006.01)
*H05K 1/02* (2006.01)
(Continued)

(52) U.S. Cl.
CPC .......... *H05K 1/0281* (2013.01); *G09F 9/301* (2013.01); *G09F 15/0012* (2013.01);
(Continued)

(58) Field of Classification Search
CPC ... G02F 1/13306; G02F 1/1303; H05K 3/281; H01L 2924/01078
(Continued)

(56) References Cited

U.S. PATENT DOCUMENTS 8,380,327 B2 * 2/2013 Park ................. G05B 11/01
   29/592.1
2006/0107566 A1 * 5/2006 Van Rens ............. G09F 9/35
   40/515
(Continued)

FOREIGN PATENT DOCUMENTS

CN   1902672    1/2007
CN   101064075   10/2007
(Continued)

OTHER PUBLICATIONS

International Search Report dated Jan. 30, 2013 From the Korean Intellectual Property Office Re. Application No. PCT/KR2012/009367 and Its Translation Into English.

*Primary Examiner* — Yuriy Semenenko
(74) *Attorney, Agent, or Firm* — STIP Law Group, LLC

(57) ABSTRACT

A support-type display device (100) of the present invention comprises: a fixing member (110) which is fixed to a support (200); a display panel (120) which is fixed to one side of the fixing member (110), and has a flexible form that can be rolled and unrolled; and shape maintenance means (130) which are respectively installed along upper and lower parts of the display panel (120), and roll the display panel (120) or unroll in the shape of a flat board to maintain the rolled or unrolled state if an external force is applied. The present invention is installed on an outdoor support and is used for advertising and/or prevention, wherein a flexible display panel which can be rolled and unrolled is used such that the display panel is unrolled only when necessary, whereby the invention can be used for advertising and/or prevention.

8 Claims, 5 Drawing Sheets (a)

(b)

(51) Int. Cl.
  *G09F 9/30* (2006.01)
  *G09F 15/00* (2006.01)
  *G09F 19/22* (2006.01)
  *H05K 5/00* (2006.01)
  *H05K 7/20* (2006.01)

(52) U.S. Cl.
  CPC ...... *G09F 15/0037* (2013.01); *G09F 15/0087* (2013.01); *G09F 19/22* (2013.01); *H05K 5/0017* (2013.01); *H05K 7/20954* (2013.01); *F05B 2220/25* (2013.01); *G09F 2019/225* (2013.01); *Y02E 10/721* (2013.01)

(58) Field of Classification Search
  USPC ............... 349/58, 139–143, 147; 353/119;
         361/679.01–679.02, 679.21, 679.26,
         361/679.27, 679.28, 748–751, 755, 780
  See application file for complete search history.

(56) References Cited

U.S. PATENT DOCUMENTS

| | | | | |
|---|---|---|---|---|
| 2007/0241002 A1* | 10/2007 | Wu | ....................... | G06F 1/1601 |
| | | | | 206/150 |
| 2008/0086925 A1* | 4/2008 | Yang | .................. | H04M 1/0268 |
| | | | | 40/610 |
| 2011/0188189 A1* | 8/2011 | Park | ....................... | G05B 11/01 |
| | | | | 361/679.05 |
| 2013/0038584 A1* | 2/2013 | Burgin | .................... | G09F 9/30 |
| | | | | 345/205 |
| 2014/0209445 A1* | 7/2014 | Iwawaki | ................. | G06F 3/016 |
| | | | | 200/600 |

FOREIGN PATENT DOCUMENTS

| | | | |
|---|---|---|---|
| CN | 101887660 | A | 11/2010 |
| CN | 201698655 | U | 1/2011 |
| JP | 05-139353 | A | 6/1993 |
| JP | 07-076935 | A | 3/1995 |
| JP | 07-334105 | | 12/1995 |
| JP | 07334105 | A * | 12/1995 |
| JP | 11-109880 | | 4/1999 |
| JP | 2004-252342 | A | 9/2004 |
| JP | 2005-087391 | A | 4/2005 |
| JP | 2006-053289 | A | 2/2006 |
| JP | 2006-061309 | A | 3/2006 |
| JP | 2006-113504 | A | 4/2006 |
| JP | 2006-163099 | | 6/2006 |
| JP | 2006-163099 | A | 6/2006 |
| JP | 2006163099 | A * | 6/2006 |
| JP | 2007-519031 | | 7/2007 |
| JP | 3143895 | | 8/2008 |
| KR | 1020110088987 | A | 8/2011 |
| RU | 2415479 | C1 | 3/2011 |
| WO | WO 2013/069970 | | 5/2013 |

* cited by examiner

SUPPORT-TYPE DISPLAY DEVICE

CROSS-REFERENCE TO RELATED APPLICATIONS

This application is a National phase of PCT Patent Application No. PCT/KR2012/009367 having International filing date of Nov. 8, 2012, which claims the benefit of priority of Korean Patent Application No. 10-2011-0116810 filed on Nov. 10, 2011. The contents of the above applications are all incorporated by reference as if fully set forth herein in their entirety.

TECHNICAL FIELD

The present invention relates to a display device, and more particularly, to a support type display device installed in an outdoor support and that can use for advertisement and/or disaster prevention.

BACKGROUND ART

In general, an outdoor advertisement device is installed in a building rooftop or other structures to display advertisement requested by an advertiser. Because such an outdoor advertisement device can display advertisement contents through a large-sized advertising board or a large-sized screen, the outdoor advertisement device has high visual transfer effect and is thus much used as one of advertisement methods. Nowadays, at a location in which many persons gather such as the bus stop side and a shopping center, an outdoor advertisement display device using a light emitting diode (LED) display is installed and operated.

When a natural disaster such as heavy rain, typhoon, and cold wave occurs, in order to notify or warn the natural disaster, a disaster prevention text is displayed through a large-sized advertising board or a large-sized screen installed at outdoor.

DETAILED DESCRIPTION OF INVENTION

Technical Problem

The present invention has been made in view of the above problems, and provides a support type display device installed in an outdoor support to be used for advertisement and/or disaster prevention and that can use for advertisement and/or disaster prevention by unrolling only in a necessary case using a flexible display panel that can be rolled and unrolled.

Technical Solution

In accordance with an aspect of the present invention, a support type display device includes: a fixing member fixed to a support; a display panel fixed to one side of the fixing member and having a flexible form that can be rolled and unrolled; and a shape maintaining means installed in an upper portion and a lower portion, respectively, of the display panel and that rolls the display panel in a roll form or that unrolls the display panel in a flat plate form to maintain a state, when an external force is applied.

Preferably, the shape maintaining means includes a pair of shape storage members made of a shape storage alloy to be rolled like a spring at a normal time and to be unrolled in a flat plate form at a predetermined temperature or more and a heat source providing member formed integrally with the shape storage member or coupled along the shape storage member to provide a heat source to the shape storage member.

Preferably, the heat source providing member is a flexible heat wire that can be rolled or unrolled integrally with the shape storage member.

Preferably, the shape maintaining means includes a pair of shape maintaining members that roll like a spring at a normal time and that unroll in a straight line form when a gas is injected and a gas injection member that injects a gas into an inlet of the shape maintaining member.

Preferably, the support is one of a support of a building rooftop and a wind-power generation device of the sea or the land.

Preferably, in a state in which the display panel is rolled or unrolled, the fixing member is formed in a plate form having a width that can cover a rear surface of the display panel.

Preferably, one side of the fixing member is fixed to one side of the display panel and the other side thereof is fixed to the support, but in a state in which the display panel is rolled or unrolled, the fixing member supports the display panel in a state protruded from the support.

Advantageous Effects

According to the present invention, by installing a flexible display panel in an outdoor support and by unrolling a flexible display panel that can roll and unroll only in a necessary case for advertisement and/or disaster prevention, a support type display device can be used for advertisement and/or disaster prevention.

BRIEF DESCRIPTION OF DRAWINGS

FIG. 1A is a perspective view illustrating a support type display device of a rolled state and FIG. 1B is a perspective view illustrating a support type display device of an unrolled state.

FIG. 3A is a perspective view illustrating a support type display device of a rolled state and FIG. 3B is a perspective view illustrating a support type display device of an unrolled state.

FIG. 7A is a perspective view illustrating a support type display device of a rolled state and FIG. 7B is a perspective view illustrating a support type display device of an unrolled state.

FIG. 9A is a perspective view illustrating a support type display device of a rolled state and FIG. 9B is a perspective view illustrating a support type display device of an unrolled state.

BEST MODES FOR CARRYING OUT THE INVENTION

Hereinafter, a support type display device according to an exemplary embodiment of the present invention will be described in detail with reference to the accompanying drawings.

First Exemplary Embodiment

Figure 1:
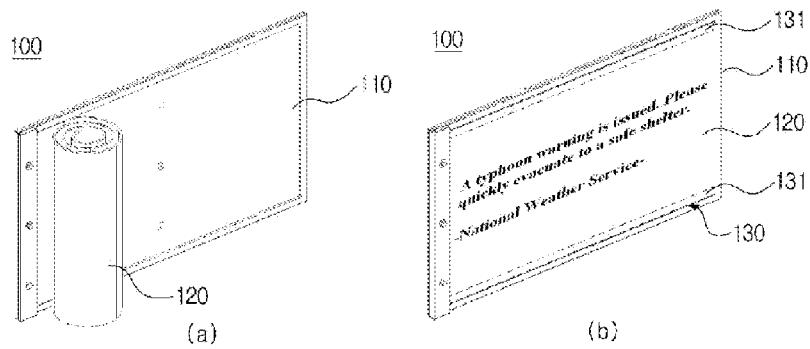
FIG. 1 is a perspective view illustrating a configuration relationship of a support type display device according to a first exemplary embodiment of the present invention.
Figure 2:
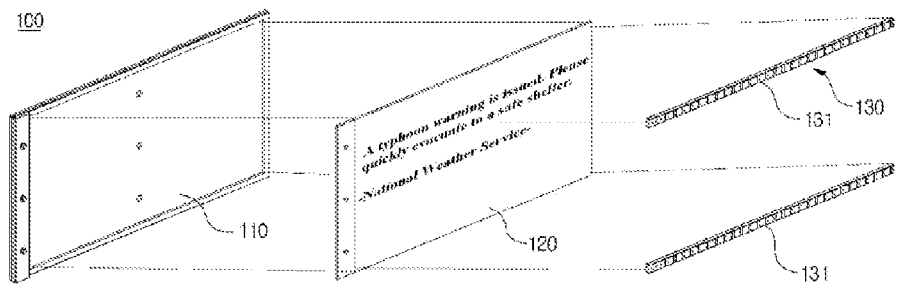
FIG. 2 is an exploded perspective view illustrating the support type display device of FIG. 1.
Figure 3:
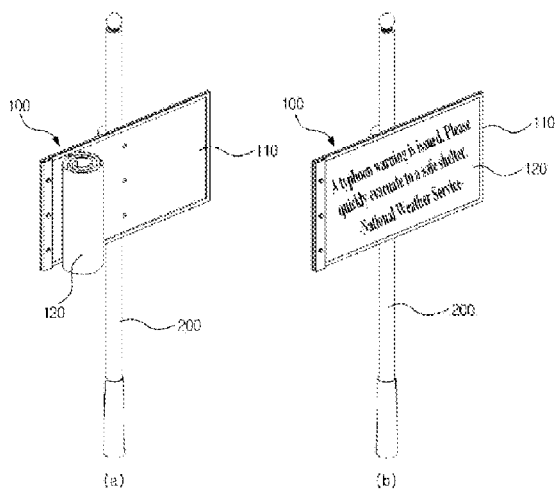
FIG. 3 is a perspective view illustrating a state in which the support type display device of FIG. 1 is installed in a support.

FIG. 1 is a perspective view illustrating a configuration relationship of a support type display device according to a first exemplary embodiment of the present invention; FIG. 1A is a perspective view illustrating a support type display device of a rolled state and FIG. 1B is a perspective view illustrating a support type display device of an unrolled state, FIG. 2 is an exploded perspective view illustrating the support type display device of FIG. 1, and FIG. 3 is a perspective view illustrating a state in which the support type display device of FIG. 1 is installed in a support; FIG. 3A is a perspective view illustrating a support type display device of a rolled state and FIG. 3B is a perspective view illustrating a support type display device of an unrolled state.

As shown in FIGS. 1 to 3, a support type display device 100 according to the present exemplary embodiment includes a fixing member 110 fixed to a support 200, a display panel 120 fixed to one side of the fixing member 110 and having a flexible form that can be rolled and unrolled, and a shape maintaining means 130 installed in an upper portion and a lower portion, respectively of the display panel 120 and that maintains a state by rolling and unrolling the display panel 120, when an external force is applied.

The fixing member 110 is fixed to the support 200 to perform a function of supporting the display panel 120 and is formed in a general plate form. That is, in a state in which the display panel 120 is rolled or unrolled, the fixing member 110 is formed in a plate form having a width that can cover a rear surface of the display panel 120. When fixing the fixing member 110 to the support 200, a plurality of fixed grooves are formed in the fixing member 110, and after a screw is inserted into the plurality of fixed grooves, the fixing member 110 is fastened and fixed to the support 200 or at a rear surface of the fixing member 110, a clamping device for fixing the fixing member 110 to the support 200 may be installed and fixed. Here, the clamping device may be formed with various constituent elements fixed in a state inserted into a circumference of the support 200 or fixed by a separate clamping member in a state disposed at a circumference of the support 200. That is, when fixing the fixing member 110 to the support 200, the fixing member 110 may be fixed with various methods using in an industrial field in addition to the above method.

The display panel 120 is fixed to one side of the fixing member 110 to be supported by the fixing member 110 and has a flexible form that can be rolled and unrolled. That is, the display panel 120 of the present exemplary embodiment has a flexible form that can be unrolled in a flat plate form after being rolled in a roll form by an external force applied from the outside. Here, when an external force is applied, the display panel 120 is rolled in a roll form in a lengthwise direction, and when an external force is removed, the display panel 120 is unrolled in a flat plate form. As the display panel 120 of the present exemplary embodiment is flexibly formed, the display panel 120 is formed similar to a general display panel, except for a case of unrolling in a flat plate form after rolling in a roll form, and is thus formed to perform the same function.

When fixing the display panel 120 to one side of the fixing member 110, a plurality of fixed grooves are formed along one side of the display panel 120, and a screw is inserted into the plurality of fixed grooves and is fastened and fixed to the fixing member 110. That is, when fixing the display panel 120 to the fixing member 110, the display panel 120 may be fixed with various methods using in an industrial filed in addition to the above method. When fixing the display panel 120 to one side of the fixing member 110, in a state in which a reinforced plate is reinforced along one side of the display panel 120, in order to protect the display panel 120, it is preferable to fasten and fix the display panel 120 to the fixing member 110. It is preferable to have a protection plate installed in a width direction at the free end side of the display panel 120 and that can smoothly roll and unroll the display panel 120 while protecting the display panel 120.

Therefore, in a state in which an external force is not applied to the shape maintaining means 130, after the display panel 120 is rolled in a roll form at one side of the fixing member 110, as shown in FIGS. 1A and 3A, when an external force is applied to the shape maintaining means 130, the display panel 120 is unrolled in a flat plate form that covers a surface of the fixing member 110, as shown in FIGS. 1B and 3B. That is, when the display panel 120 is not used for advertisement and/or disaster prevention, as shown in FIGS. 1A and 3A, the display panel 120 is rolled in a roll form at one side of the fixing member 110, and when the display panel 120 is used for advertisement and/or disaster prevention, as shown in FIGS. 1B and 3B, the display panel 120 is unrolled in a flat plate form that covers a surface of the fixing member 110 and is used for advertisement and/or disaster prevention.

The shape maintaining means 130 are installed at an upper portion and a lower portion, respectively of the display panel 120, and when an external force is applied, the display panel 120 is unrolled in a flat plate form, and when an external force is removed, the shape maintaining means 130 performs a function of maintaining an original rolling state. The shape maintaining means 130 of the present exemplary embodiment is formed with a pair of shape storage members 131 made of a shape storage alloy to roll like a spring at a normal time and to unroll in a straight plate form in a predetermined temperature or more and a heat source providing member (not shown) integrally formed with the shape storage member 131 or coupled along the shape storage member 131 to provide a heat source to the shape storage member 131. Here, the heat source providing member may be formed with a flexible heat wire that can be rolled or unrolled integrally with the shape storage member 131.

The shape maintaining means 130 of the present exemplary embodiment is formed with a pair of shape maintaining members (not shown) that rolls like a spring at a normal time and that unrolls in a straight line form when a gas such as air is injected and a gas injection member (not shown) that injects a gas such as air into an inlet of the shape maintaining member. Here, the shape maintaining member has a passage that injects a gas provided through the gas injection member and has a spring member that can roll like a spring at a normal time. Therefore, the shape maintaining member is rolled by a spring member at a normal time and is unrolled in a straight line form when a gas provided through the gas injection member is injected along a passage.

Figure 4:
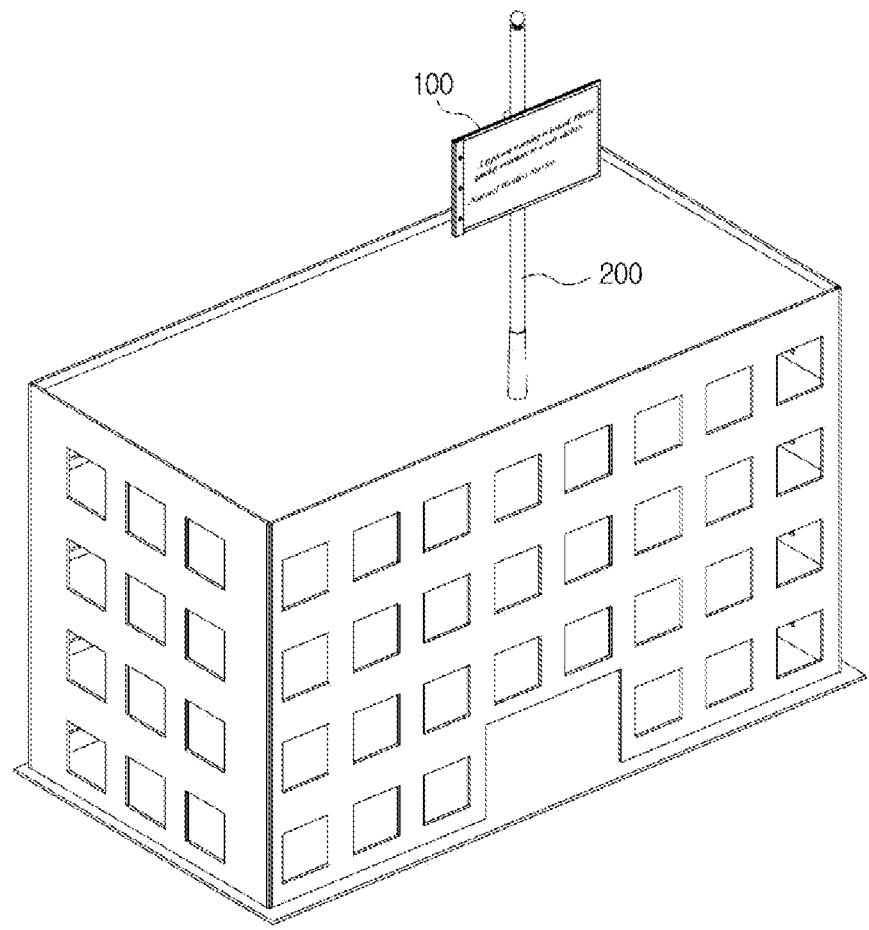
FIG. 4 is a perspective view illustrating a state in which the support type display device of FIG. 1 is installed in a rooftop of a building.
Figure 5:
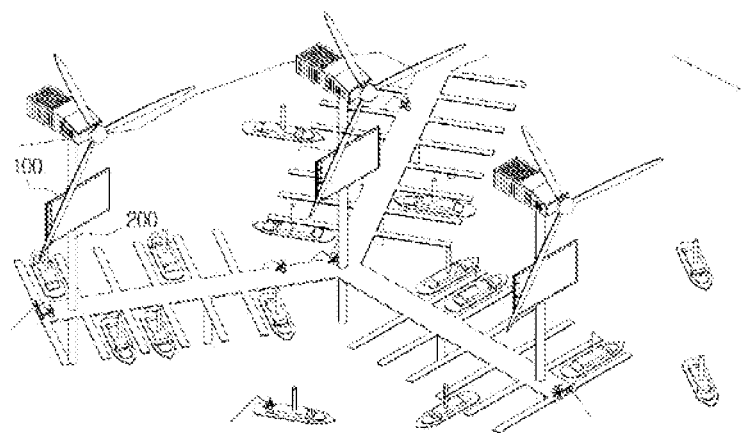
FIG. 5 is a perspective view illustrating a state in which the support type display device of FIG. 1 is installed in a wind-power generation device of the sea.
Figure 6:
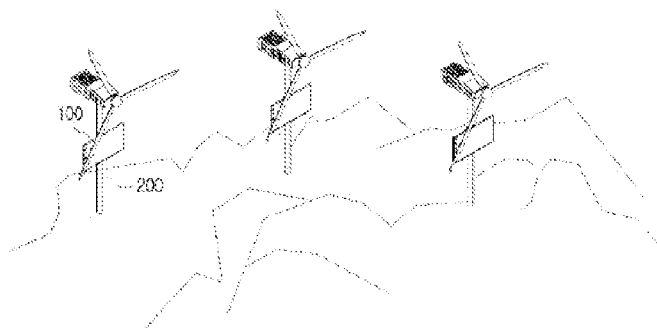
FIG. 6 is a diagram illustrating a state in which the support type display device of FIG. 1 is installed in a wind-power generation device of the land.

The support type display device 100 according to the present exemplary embodiment having the above-described configuration may be installed and used in a general support, as shown in FIG. 3. Further, the support type display device 100 according to the present exemplary embodiment may be installed and used in a support of a building rooftop, as shown in FIG. 4 and in a tower (corresponds to the support) of a wind-power generation device of the sea or the land, as shown in FIGS. 5 and 6. That is, the support type display device 100 according to the present exemplary embodiment is installed at various locations having a support in addition to the building or the wind-power generation device to be used as advertisement and/or disaster prevention. In the drawing, FIGS. 4 to 6 are diagrams illustrating a state in which the support type display device of FIG. 1 is installed in a rooftop of a building, a wind-power generation device of the sea, or a wind-power generation device of the land.

The support type display device 100 according to the present exemplary embodiment is connected to a central controller formed with an advertisement management unit connected by a network to the support type display device 100 to manage advertisement provided to the display panel 120 and/or an information providing unit that provides disaster information to the display panel 120 and an operation controller that controls operation for maintaining the display panel 120 in a rolling state or a unrolling state through operation control of the shape maintaining means 130. Here, a connection between the central controller and the support type display device 100 of the present exemplary embodiment is available by wired and wireless communication as well as communication using a power line that can perform urgent communication.

Therefore, when a user displays advertisement or notifies a disaster prevention fact in the display panel 120, the user first operates an operation controller of the central controller and thus an external force is applied to the shape maintaining means 130. That is, when a shape storage member 131 is used as the shape maintaining means 130, a heat source is provided to a heat source providing member, and when the shape maintaining member is used as the shape maintaining means 130, a gas is injected into the gas injection member. Thereby, the rolled shape storage member 131 or shape maintaining member is gradually unrolled in a straight line form and the display panel 120 is gradually unrolled in a straight line form. That is, as shown in FIGS. 1A and 3A, the display panel 120 rolled in a roll form at one side of the fixing member 110 is unrolled in a flat plate form that covers a surface of the fixing member 110, as shown in FIGS. 1B and 3B. Thereafter, by operating an advertisement management unit or an information providing unit of the central controller, specific advertisement or disaster prevention information may be displayed.

As described above, while displaying specific advertisement or disaster prevention information through the display panel 120, when a display is no longer necessary, by stop displaying by operating a central controller and by removing an external force applied to the shape maintaining means 130, the shape maintaining means 130 is returned to an original rolling form and thus the display panel 120 is gradually rolled and maintains a state rolled in a roll form at one side of the fixing member 110, as shown in FIGS. 1A and 3A.

MODES FOR CARRYING OUT THE INVENTION

Second Exemplary Embodiment

Figure 7:
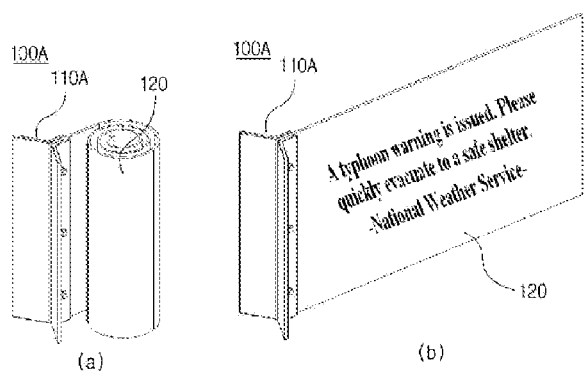
FIG. 7 is a perspective view illustrating a configuration relationship of a support type display device according to a second exemplary embodiment of the present invention.
Figure 8:
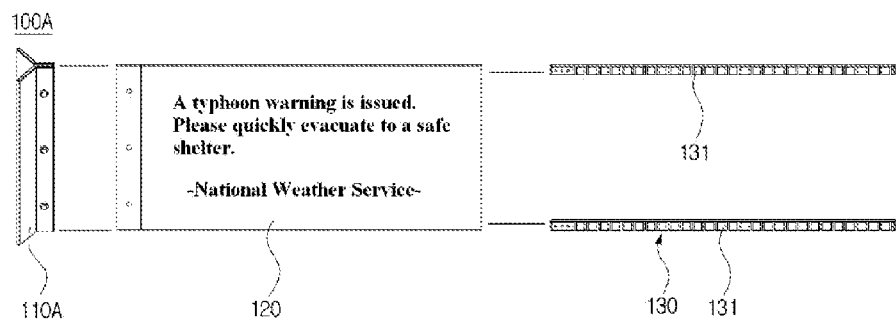
FIG. 8 is an exploded perspective view illustrating the support type display device of FIG. 7.
Figure 9:
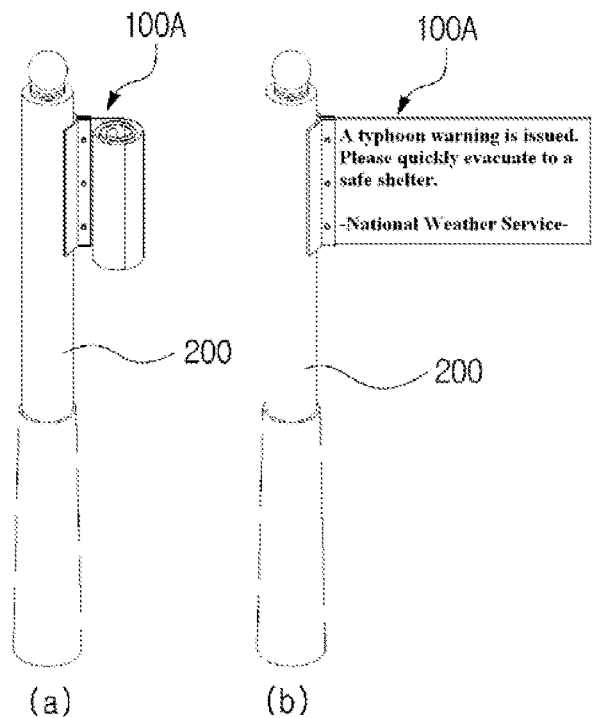
FIG. 9 is a perspective view illustrating a state in which the support type display device of FIG. 7 is installed in a support.

FIG. 7 is a perspective view illustrating a configuration relationship of a support type display device according to a second exemplary embodiment of the present invention; FIG. 7A is a perspective view illustrating a support type display device of a rolled state and FIG. 7B is a perspective view illustrating a support type display device of an unrolled state, FIG. 8 is an exploded perspective view illustrating the support type display device of FIG. 7, and FIG. 9 is a perspective view illustrating a state in which the support type display device of FIG. 7 is installed in a support; FIG. 9A is a perspective view illustrating a support type display device of a rolled state and FIG. 9B is a perspective view illustrating a support type display device of an unrolled state.

As shown in FIGS. 7 to 9, a support type display device 100A according to the present exemplary embodiment is formed similar to the support type display device 100 of the first exemplary embodiment, except that the support type display device 100A according to the present exemplary embodiment is formed differently from a form and a structure of a fixing member 110A fixed to the support 200. Therefore, in the present exemplary embodiment, like reference numerals designate like elements throughout the specification and therefore a detailed description thereof will be omitted.

The fixing member 110A of the present exemplary embodiment has a structure in which one side thereof fixes one side of the display panel 120 and in which the other side thereof is fixed to the support 200, unlike the fixing member 110 of the first exemplary embodiment having a plate form.

Therefore, in the support type display device 100A according to the present exemplary embodiment, in a state in which an external force is not applied to the shape maintaining means 130, the display panel 120 is rolled in a roll form at one side of the fixing member 110A to have a form protruded a little to the outside of the support 200, as shown in FIGS. 7A and 9A, and when an external force is applied to the shape maintaining means 130, the display panel 120 has a form unrolled to one side of the support 200 like a national flag hoisted to a bar, as shown in FIGS. 7B and 9B.

Figure 10:
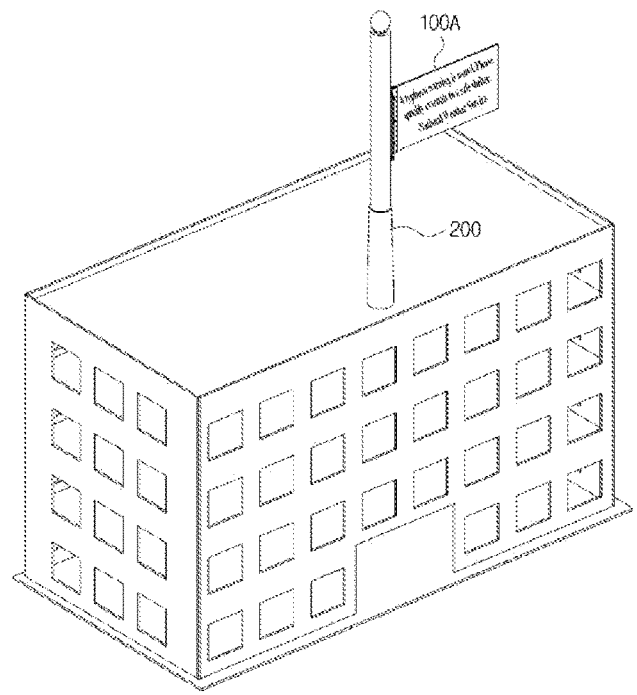
FIG. 10 is a perspective view illustrating a state in which the support type display device of FIG. 7 is installed in a rooftop of a building.
Figure 11:
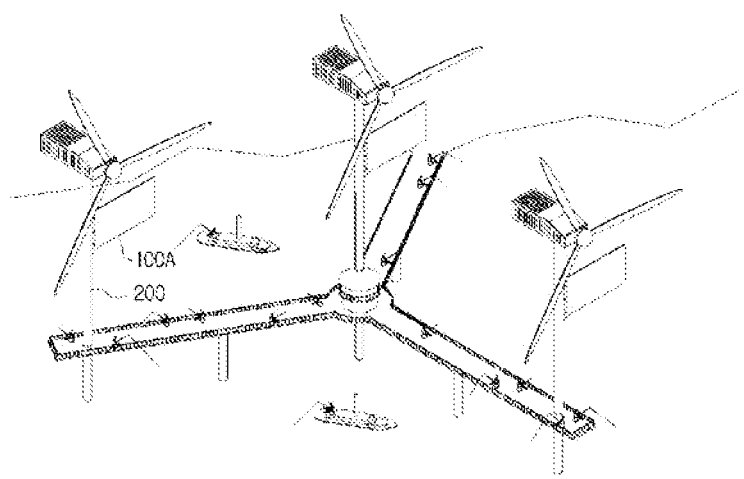
FIG. 11 is a perspective view illustrating a state in which the support type display device of FIG. 7 is installed in a wind-power generation device of the sea.
Figure 12:
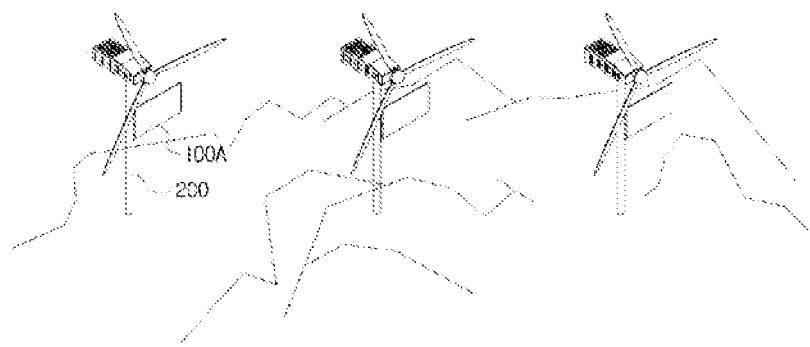
FIG. 12 is a perspective view illustrating a state in which the support type display device of FIG. 7 is installed in the support type display device of the land.

The support type display device 100A according to the present exemplary embodiment having the above-described configuration may be used by installing in a general support, as shown in FIG. 9. Further, the support type display device 100A according to the present exemplary embodiment may be used by installing a support of a building rooftop, as shown in FIG. 10 and may be used by installing in a tower (corresponding to a support) of a wind-power generation device of the sea or the land, as shown in FIGS. 11 and 12. That is, the support type display device 100A according to the present exemplary embodiment may be used for advertisement and/or disaster prevention by installing at various locations having a support in addition to the building or the wind-power generation device. In the drawing, FIGS. 9 to 12 are diagrams illustrating a state in which the support type display device of FIG. 7 is installed in a building rooftop and a wind-power generation device of the sea or the land, respectively.

INDUSTRIAL APPLICABILITY

According to the present invention, by installing a flexible display panel in an outdoor support and by unrolling a flexible display panel that can roll and unroll only in a necessary case for advertisement and/or disaster prevention, a support type display device can be used for advertisement and/or disaster prevention.

In the foregoing description, a support type display device of the present invention will be described with reference to the accompanying drawings, but this illustrates an exemplary embodiment of the present invention. Although exemplary embodiments of the present invention have been described in detail hereinabove, it should be clearly understood that many variations and modifications of the basic inventive concepts herein taught which may appear to those skilled in the present art will still fall within the spirit and scope of the present invention, as defined in the appended claims.

The invention claimed is:

1. A support type display device, comprising:
   a fixing member having a flat plate form and fixed to a support;
   a flexible display panel having one side of the flexible display panel fixed to one side of the fixing member and having a flexible form that can be rolled or unrolled laterally; and
   a shape maintaining means installed in an upper portion and a lower portion, respectively, of the display panel, and that rolls the display panel in a roll form, or unrolls the display panel in the flat plate form to maintain a state,
   wherein the display panel is rolled in the roll form at the one side of the fixing member, and the display panel is unrolled in the flat plate form that covers a surface of the fixing member,
   wherein the shape maintaining means comprises a pair of shape storage members made of a shape storage alloy to be rolled like a spring at a normal time and to be unrolled in the flat plate form at a predetermined temperature or more and a heat source providing member formed integrally with the shape storage member or coupled along the shape storage member to provide the heat source to the shape storage member.

2. The support type display device of claim 1, wherein the heat source providing member is a flexible heat wire that can be rolled or unrolled integrally with the shape storage member.

3. The support type display device of claim 1, wherein the fixing member is formed in a flat plate form having a width that can cover a rear surface of the display panel in a state in which the display panel is rolled or unrolled.

4. The support type display device of claim 1, wherein an other side of the fixing member is fixed to the support, but in a state in which the display panel is rolled or unrolled, the fixing member supports the display panel in a state protruded from the support.

5. The support type display device of claim 1, wherein the fixing member is formed in the plate form having a width that can cover a rear surface of the display panel in a state in which the display panel is rolled or unrolled.

6. The support type display device of claim 2, wherein the fixing member is formed in the plate form having a width that can cover a rear surface of the display panel in a state in which the display panel is rolled or unrolled.

7. The support type display device of claim 1, wherein an other side of the fixing member is fixed to the support, but in a state in which the display panel is rolled or unrolled, the fixing member supports the display panel in a state protruded from the support.

8. The support type display device of claim 2, wherein an other side of the fixing member is fixed to the support, but in a state in which the display panel is rolled or unrolled, the fixing member supports the display panel in a state protruded from the support.

* * * * *